US012094945B2

(12) United States Patent
Won et al.

(10) Patent No.: US 12,094,945 B2
(45) Date of Patent: Sep. 17, 2024

(54) SEMICONDUCTOR STRUCTURE AND FORMING METHOD THEREOF

(71) Applicant: CHANGXIN MEMORY TECHNOLOGIES, INC., Hefei (CN)

(72) Inventors: Daejoong Won, Hefei (CN); Soonbyung Park, Hefei (CN); Er-Xuan Ping, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 434 days.

(21) Appl. No.: 17/452,788

(22) Filed: Oct. 29, 2021

(65) Prior Publication Data
US 2022/0293722 A1    Sep. 15, 2022

Related U.S. Application Data

(63) Continuation of application No. PCT/CN2021/110749, filed on Aug. 5, 2021.

(30) Foreign Application Priority Data

Mar. 11, 2021    (CN) .......................... 202110267911.0

(51) Int. Cl.
*H01L 29/423*    (2006.01)
*H01L 29/06*    (2006.01)
(Continued)

(52) U.S. Cl.
CPC ...... *H01L 29/4236* (2013.01); *H01L 29/0607* (2013.01); *H01L 29/401* (2013.01);
(Continued)

(58) Field of Classification Search
CPC ........... H01L 29/4236; H01L 29/42376; H01L 29/7825; H01L 29/4966; H01L 29/512; H01L 29/42368; H01L 29/0607
See application file for complete search history.

(56) References Cited

U.S. PATENT DOCUMENTS 9,530,849 B2    12/2016 Oh et al.
9,589,960 B1 *    3/2017 Min .................. H01L 29/66621
(Continued)

FOREIGN PATENT DOCUMENTS

CN    104810390 A    7/2015
CN    106935650 A    7/2017
(Continued)

OTHER PUBLICATIONS

International Search Report cited in PCT/CN2021/110749, mailed Nov. 25, 2021, 10 pages.
(Continued)

*Primary Examiner* — Joseph C. Nicely
(74) *Attorney, Agent, or Firm* — Kilpatrick Townsend & Stockton LLP

(57) ABSTRACT

A semiconductor structure and a forming method thereof are disclosed in the embodiments of the present disclosure. The semiconductor structure includes: a base, wherein a gate dielectric layer defining a groove is provided in the base, a source region and a drain region are located on two opposite sides at a top of the groove, and the groove has an extension direction parallel to a surface of the base; a first gate, including a first work function layer and a first conductive layer, wherein the first work function layer covers a bottom surface and partial sidewall of the groove, and the first conductive layer covers a surface of the first work function layer; and a second gate, including a second work function layer and a second conductive layer, wherein the second gate is laminated on the first gate and has a top surface lower than the surface of the base.

16 Claims, 7 Drawing Sheets

(51) Int. Cl.
    *H01L 29/40*     (2006.01)
    *H01L 29/49*     (2006.01)
    *H01L 29/51*     (2006.01)
    *H01L 29/66*     (2006.01)
    *H01L 29/78*     (2006.01)

(52) U.S. Cl.
    CPC .. *H01L 29/42368* (2013.01); *H01L 29/42376* (2013.01); *H01L 29/4966* (2013.01); *H01L 29/512* (2013.01); *H01L 29/66621* (2013.01); *H01L 29/7825* (2013.01)

(56) References Cited

U.S. PATENT DOCUMENTS

| | | | |
|---|---|---|---|
| 9,748,248 B2 | 8/2017 | Kang | |
| 10,050,038 B2 | 8/2018 | Lee et al. | |
| 10,741,643 B2 | 8/2020 | Ryu | |
| 2015/0349073 A1* | 12/2015 | Kang | H01L 29/66621 |
| | | | 257/330 |
| 2016/0172488 A1* | 6/2016 | Oh | H10B 12/315 |
| | | | 257/330 |
| 2017/0125422 A1* | 5/2017 | Kang | H01L 29/7813 |
| 2017/0365608 A1* | 12/2017 | Lee | H01L 29/4236 |
| 2019/0259839 A1* | 8/2019 | Ryu | H01L 29/66734 |
| 2020/0105765 A1* | 4/2020 | Kim | H01L 29/42368 |
| 2020/0151070 A1 | 5/2020 | Lee et al. | |

FOREIGN PATENT DOCUMENTS

| | | |
|---|---|---|
| CN | 107527912 A | 12/2017 |
| CN | 110190054 A | 8/2019 |
| CN | 113054005 A | 6/2021 |

OTHER PUBLICATIONS

Gautam, et al., "Reduction of GIDL using Dual Work-Function Metal Gate in DRAM", ChangXin Memory Technologies Inc.. Downloaded on Dec. 2, 2020, 4 pages.

* cited by examiner

SEMICONDUCTOR STRUCTURE AND FORMING METHOD THEREOF

CROSS-REFERENCE TO RELATED APPLICATIONS

This is a continuation of International Application No. PCT/CN2021/110749, filed on Aug. 5, 2021, which is based on and claims the priority to Chinese Patent Application No. 202110267911.0, titled "SEMICONDUCTOR STRUCTURE AND FORMING METHOD THEREOF" and filed on Mar. 11, 2021. The entire contents of International Application No. PCT/CN2021/110749 and Chinese Patent Application No. 202110267911.0 are incorporated herein by reference.

TECHNICAL FIELD

Embodiments of the present disclosure relate to, but are not limited to, a semiconductor structure and a forming method thereof.

BACKGROUND

When a gate-drain overlap region has a strong electric field, band-to-band tunneling of electrons near the interface of the overlap region occurs between a valence band and a conduction band to form a current, which is generally referred to as gate-induced drain leakage (GIDL).

The magnitude of the GIDL current is related to the thickness of a gate dielectric layer near the drain. A higher thickness indicates a smaller GIDL current. Therefore, in order to solve the problem of GIDL current, the existing methods usually use a thicker gate dielectric layer in a MOS transistor. However, the thicker gate dielectric layer weakens the gate control over the trench and causes a threshold voltage to rise. As a result, the MOS transistor needs a higher driving voltage.

SUMMARY

An overview of the subject matter detailed in the present disclosure is provided below, which is not intended to limit the protection scope of the claims.

According to a first aspect, the embodiments of the present disclosure provide a semiconductor structure, including: a base, including a source region, a drain region, and a gate dielectric layer, wherein the gate dielectric layer is located between the source region and the drain region, the gate dielectric layer defines a groove, the source region and the drain region are located on two opposite sides at a top of the groove, and the groove has an extension direction parallel to a surface of the base; a first gate, including a first work function layer and a first conductive layer, wherein the first gate is filled in the groove, the first work function layer covers a bottom surface and partial sidewall of the groove, the first conductive layer covers a surface of the first work function layer, and a top surface of the first conductive layer is flush with or lower than a top surface of the first work function layer; a second gate, including a second work function layer and a second conductive layer, wherein the second gate is laminated on the first gate and has a top surface lower than the surface of the base, the second work function layer covers partial sidewall of the groove, the second conductive layer covers a surface of the second work function layer, a top surface of the second conductive layer is flush with or lower than a top surface of the second work function layer, and in a direction perpendicular to the surface of the base, resistance of per unit thickness of the second conductive layer is less than resistance of per unit thickness of the first conductive layer; and an isolation layer, laminated on the second gate and fully filling the groove.

According to a second aspect, the embodiments of the present disclosure provide a method of forming a semiconductor structure, including: providing a base, the base includes a source region, a drain region, and a gate dielectric layer, wherein the gate dielectric layer is located between the source region and the drain region, the gate dielectric layer defines a groove, the source region and the drain region are located on two opposite sides at a top of the groove, and the groove has an extension direction parallel to a surface of the base; forming a first gate, the first gate includes a first work function layer and a first conductive layer, wherein the first gate is filled in the groove, the first work function layer covers a bottom surface and partial sidewall of the groove, the first conductive layer covers a surface of the first work function layer, and a top surface of the first conductive layer is flush with or lower than a top surface of the first work function layer; forming a second gate, the second gate includes a second work function layer and a second conductive layer, wherein the second gate is laminated on the first gate and has a top surface lower than the surface of the base, the second work function layer covers partial sidewall of the groove, the second conductive layer covers a surface of the second work function layer, a top surface of the second conductive layer is flush with or lower than a top surface of the second work function layer, and in a direction perpendicular to the surface of the base, resistance of per unit thickness of the second conductive layer is less than resistance of per unit thickness of the first conductive layer; and forming an isolation layer, the isolation layer is laminated on the second gate and fully fills the groove.

Other aspects of the present disclosure are understandable upon reading and understanding of the drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

DETAILED DESCRIPTION

The technical solutions in the embodiments of the present disclosure are described below clearly and completely with reference to the drawings in the embodiments of the present disclosure. Apparently, the described embodiments are merely part rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 1:
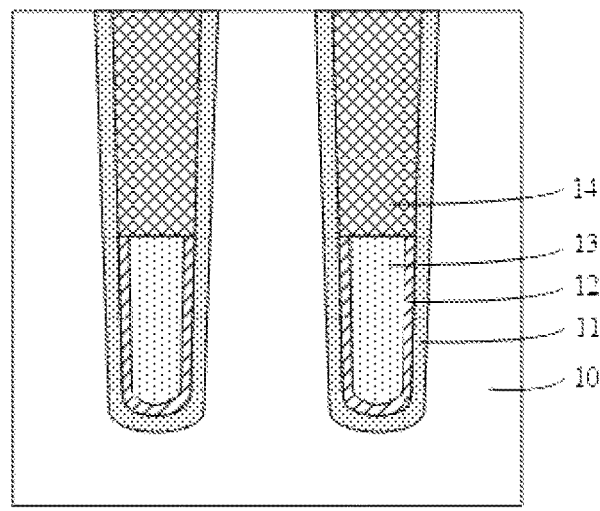
FIG. 1 is a schematic structural diagram of a semiconductor structure.

Referring to FIG. 1, the semiconductor structure includes: a base 10, including a source region (not shown), a drain region (not shown), and a gate dielectric layer 11, wherein the gate dielectric layer 11 is located between the source region and the drain region, the gate dielectric layer 11 defines a groove, the source region and the drain region are located on two opposite sides at the top of the groove, and the groove has an extension direction parallel to a surface of the base 10; a gate (not shown), including a work function layer 12 and a conductive layer 13, wherein the gate is filled in the groove, the work function layer 12 covers a bottom surface and partial sidewall of the groove, the conductive layer 13 covers a surface of the work function layer 12, and a top surface of the conductive layer 13 is flush with or lower than a top surface of the work function layer 12; and an isolation layer 14, laminated on the gate and fully filling the groove.

Figure 2:
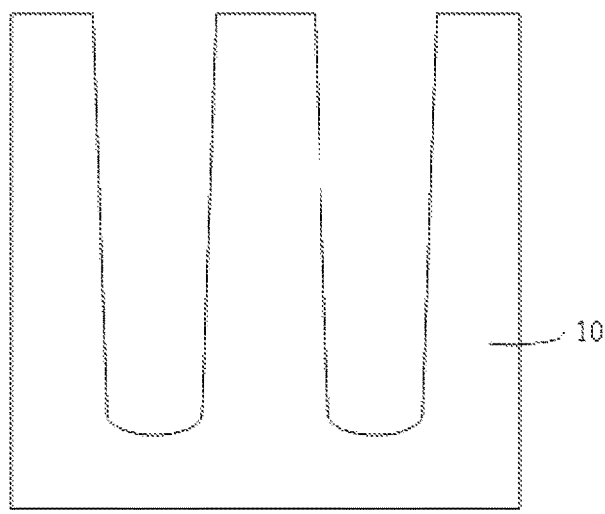
FIG. 2 to FIG. 5 are schematic structural diagrams corresponding to various steps of a method of forming a semiconductor structure.
Figure 3:
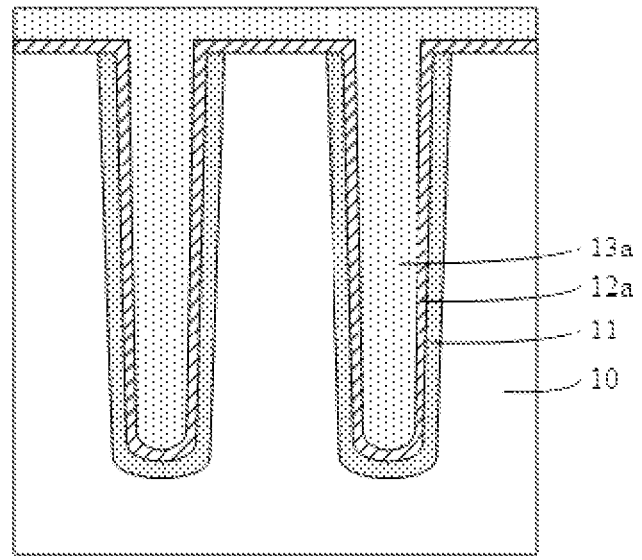
Figure 4:
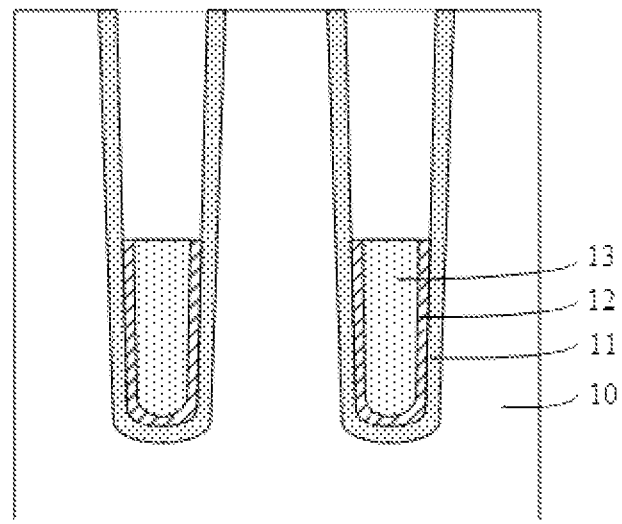
Figure 5:
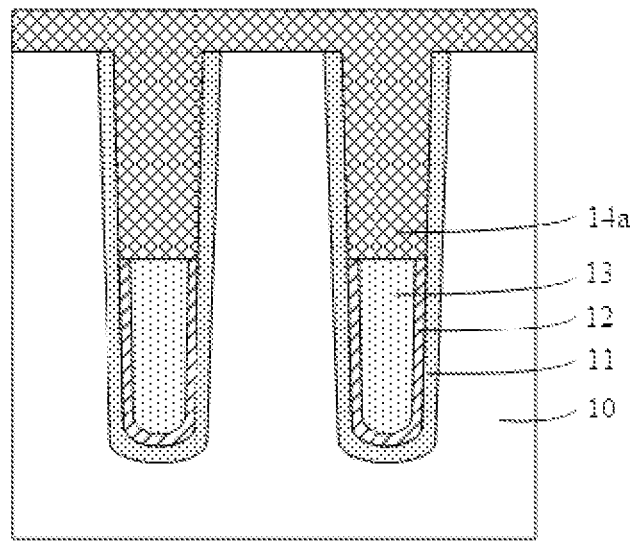

The forming the semiconductor structure shown in FIG. 1 includes: with reference to FIG. 2, providing a base 10, which is provided with an initial groove; with reference to FIG. 3, forming a gate dielectric layer 11, a work function film 12a, and a conductive film 13a, wherein the gate dielectric layer 11 covers a bottom surface and a sidewall of the initial groove and defines a groove, the work function film 12a covers a bottom surface and a sidewall of the groove and covers a top surface of the base 10, and the conductive film 13a fully fills the groove and covers a top surface of the work function film 12a; with reference to FIG. 3 and FIG. 4, etching back the work function film 12a and the conductive film 13a, and forming a work function layer 12 and a conductive layer 13, wherein the work function layer 12 and the conductive layer 13 form a gate; with reference to FIG. 5, depositing an isolation film 14a, wherein the isolation film 14a fully fills the groove and covers the surface of the base 10; and with reference to FIG. 1, performing a planarization process, removing a part of the isolation film covering the surface of the base 10, and using the remaining part of the isolation film as an isolation layer 14.

In the above semiconductor structure, in a horizontal direction perpendicular to the extension direction and parallel to the surface of the base, parts of the gate dielectric layer 11 at different positions have equal thicknesses. In order to reduce the GIDL current caused by the strong electric field in the gate-drain overlap region, a thicker gate dielectric layer 11 is generally provided. However, with a thicker gate dielectric layer 11, an excessive number of electrons that cannot be driven are likely to accumulate in the gate-drain overlap region, resulting in a stronger electric field in the gate-drain overlap region, which may eventually lead to the breakdown of the gate dielectric layer 11.

In the semiconductor structure and the forming method thereof provided in the embodiments of the present disclosure, the resistance of per unit thickness of the second conductive layer is set to be smaller, so that the partial voltage of the second conductive layer can be reduced without changing the thickness of the first conductive layer and the second conductive layer and without reducing the driving voltage of the semiconductor structure, thus weakening the electric field between the second gate and the drain, so as to reduce the GIDL current caused by the strong electric field and improve the refresh performance of the semiconductor structure.

In order to make the objectives, technical solutions and advantages of the embodiments of the present disclosure clearer, the embodiments of the present disclosure are described below with reference to the drawings. Persons of ordinary skill in the art may understand that many technical details are proposed in the embodiments of the present disclosure to help readers better understand the present application. However, even without these technical details and various changes and modifications made based on the following embodiments, the technical solutions claimed in the present disclosure may still be realized.

Figure 6:
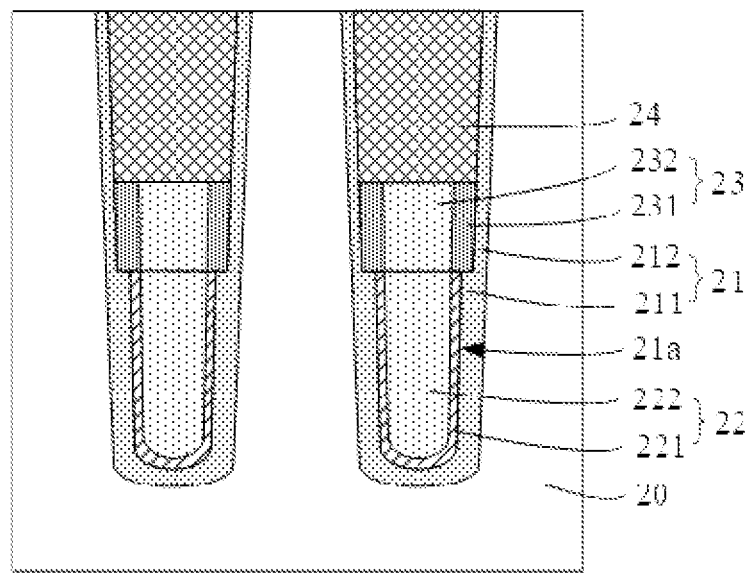
FIG. 6 is a schematic structural diagram of a semiconductor structure according to an embodiment of the present disclosure.

An exemplary embodiment of the present disclosure provides a semiconductor structure. Referring to FIG. 6, the semiconductor structure includes: a base 20, including a source region (not shown), a drain region (not shown), and a gate dielectric layer 21, wherein the gate dielectric layer 21 defines a groove 21a, the source region and the drain region are located on two opposite sides at the top of the groove 21a, and the groove 21a has an extension direction parallel to a surface of the base 20; a first gate 22, including a first work function layer 221 and a first conductive layer 222, wherein the first gate 22 is filled in the groove 21a, the first work function layer 221 covers a bottom surface and partial sidewall of the groove 21a, the first conductive layer 222 covers a surface of the first work function layer 221, and a top surface of the first conductive layer 222 is flush with or lower than a top surface of the first work function layer 221; a second gate 23, including a second work function layer 231 and a second conductive layer 232, wherein the second gate 23 is laminated on the first gate 22 and has a top surface lower than the surface of the base 20, the second work function layer 231 covers partial sidewall of the groove 21a, the second conductive layer 232 covers a surface of the second work function layer 231, a top surface of the second conductive layer 232 is flush with or lower than a top surface of the second work function layer 231, and in a direction perpendicular to the surface of the base 20, resistance of per unit thickness of the second conductive layer 232 is less than resistance of per unit thickness of the first conductive layer 222; and an isolation layer 24, laminated on the second gate 23 and fully filling the groove 21a.

The gate dielectric layer 21, the first gate 22, the second gate 23, and the isolation layer 24 jointly form a buried word line. An extension direction of the buried word line is the same as the extension direction of groove 21a, and a flow direction of the current in the word line is the same as the extension direction of the groove 21a. A vertical distance between the top surface of the second gate 23 and the top surface of the base 20 should be greater than a preset distance to avoid an overlap between the second gate 23 and the subsequently formed source region as well as drain region in the horizontal direction.

In this embodiment, in a cross section perpendicular to the extension direction, a cross section of the second conductive layer 232 is an inverted trapezoid. In a horizontal direction parallel to a bottom base of the inverted trapezoid, a minimum width of the second conductive layer 232 is greater than or equal to a maximum width of the first conductive layer 222. A cross section area of per unit thickness of the second conductive layer 232 is greater than a cross section of per unit thickness of the first conductive layer 222. This helps to reduce the resistance of per unit thickness of the second conductive layer 232, which in turn reduces the partial voltage of the second conductive layer 232 without changing the driving voltage of the word line. The smaller the partial voltage, the weaker the electric field in the overlap region between the second gate 23 and the drain region, which is conducive to suppressing the generation of the GIDL current.

The sides of the inverted trapezoid are not necessarily straight, but can be curved. The inverted trapezoid with the curved sides meets a basic shape requirement: the width of the inverted trapezoid in the horizontal direction increases from the short side to the long side.

Based on the structure of the second conductive layer 232, resistivity of a material of the second conductive layer 232 is greater than, equal to, or limitedly less than resistivity of a material of the first conductive layer 222, all of which can make the resistance of per unit thickness of the second conductive layer 232 less than the resistance of per unit thickness of the first conductive layer 222, so as to reduce the partial voltage of the second conductive layer 232.

In this embodiment, the material of the second conductive layer 232 is the same as that of the first conductive layer 222, which helps to reduce the contact resistance between the first conductive layer 222 and the second conductive layer 232, thus reducing the resistance of the first gate 22 and the second gate 23 as a whole, thereby reducing the loss and heating during the current flow and improving the performance of the buried word line.

In other embodiments, without changing the shape of the cross section of the second conductive layer, i.e., in the case wherein the cross section of the second conductive layer is still an inverted trapezoid as described above, in order to further reduce the partial voltage of the second conductive layer, the resistivity of the material of the second conductive layer can be set lower than that of the material of the first conductive layer. Alternatively, side edges of the first conductive layer and the second conductive layer are both vertical, and the width of the first conductive layer is equal to that of the second conductive layer; in order to reduce the partial voltage of the second conductive layer, the resistivity of the material of the second conductive layer can be set lower than that of the material of the first conductive layer.

In this embodiment, a work function of a material of the first work function layer 221 is greater than a work function of a material of the second work function layer 231. Since the work function of the material of the first work function layer 221 is larger, the first conductive layer 222 is less sensitive to electrons in the channel, and it is more difficult to induce a leakage current in the channel. Therefore, the channel can accommodate more electrons. The work function of the material of the second work function layer 231 can be set smaller, such that the second conductive layer 232 can drive electrons in the gate-drain overlap region to move to the channel more easily, thus reducing the electrons in the gate-drain overlap region and weakening the electric field in the gate-drain overlap region, thus suppressing the GIDL current in the gate-drain overlap region. At the same time, since the electrons are more easily driven to move towards the channel, the electron movement can be effectively controlled without applying a large driving voltage.

In this embodiment, in a cross section perpendicular to the extension direction, a horizontal width of the second work function layer 231 is greater than a horizontal width of the first work function layer 221, wherein the horizontal width refers to a width in a horizontal direction parallel to the bottom base of the inverted trapezoid. This helps to further enhance the driving capability of the second gate 23, weaken the electric field in the gate-drain overlap region, and suppress the GIDL current.

In this embodiment, the first work function layer 221 is made of one material, and the second work function layer 231 is made of another material. The first work function layer 221 and the second work function layer 231 are two independent entities. The material of the first work function layer 221 includes titanium nitride, and the material of the second work function layer 231 includes lanthanum.

In this embodiment, the gate dielectric layer 21 includes a first part 211 covered by the first gate 22 and a second part 212 covered by the second gate 23. In a horizontal direction perpendicular to the extension direction and parallel to the surface of the base 20, a width of the second part 212 is less than a width of the first part 211. This helps to enhance the driving capability of the second gate 23, further reduce the electrons in the gate-drain overlap region, and weaken the electric field in the gate-drain overlap region, thus suppressing the GIDL current in the gate-drain overlap region.

A side surface of the first part 211 which is away from the first gate 22 and a side surface of the second part 212 which is away from the second gate 23 are in the same smooth interface to reduce the width of the second part 212, which helps to reserve more space for the second gate 23, so as to avoid the thicker second work function layer 231 from occupying the space of the second conductive layer 232, and ensure the good conductivity of the second conductive layer 232 as well as the second gate 23 which uses the second conductive layer 232 as the conductive body.

In this embodiment, in the horizontal direction, a sum of a width of the first work function layer 221 and the width of the first part 211 is denoted as a first width, and a sum of a width of the second work function layer 231 and the width of the second part 212 is denoted as the second width, wherein the second width is less than or equal to the first width.

In the direction from the first gate 22 to the second gate 23, the widths of different regions of the first part 211 are equal in the horizontal direction, the widths of different regions of the second part 212 are equal in the horizontal direction, the widths of different regions of the first work function layer 221 are equal in the horizontal direction, and the widths of different regions of the second work function layer 231 decrease in the horizontal direction. In the direction from the first gate 22 to the second gate 23, the second width decreases, the first width remains unchanged, and a maximum value of the second width is equal to the first width.

In this embodiment, the resistance of per unit thickness of the second conductive layer is set to be small, so that the partial voltage of the second conductive layer can be reduced without changing the thickness of the first conductive layer and the second conductive layer and without reducing the driving voltage of the semiconductor structure, thus weakening the electric field between the second gate and the drain, so as to reduce the GIDL current caused by the strong electric field and improve the refresh performance of the semiconductor structure.

Figure 7:
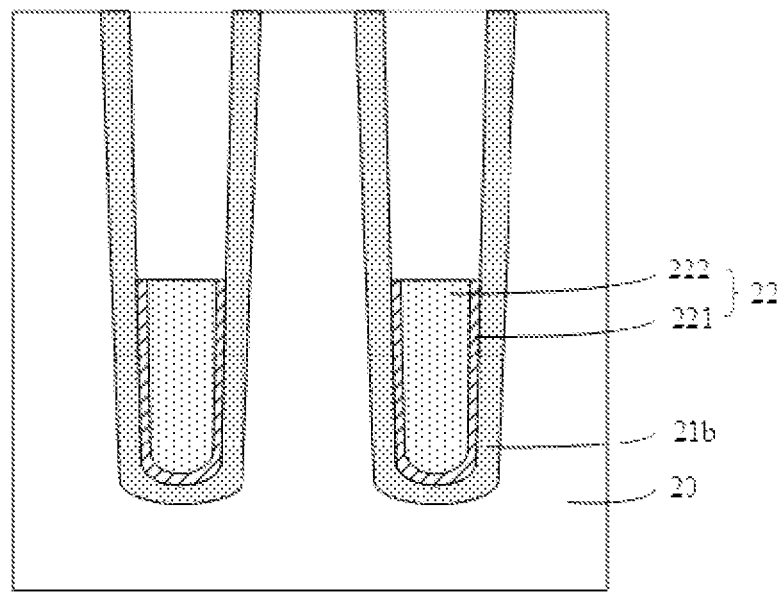
FIG. 7 to FIG. 13 are schematic structural diagrams corresponding to various steps of a method of forming a semiconductor structure according to an embodiment of the present disclosure.

An exemplary embodiment of the present disclosure provides a method of forming a semiconductor structure that can be used to form the semiconductor structure in the above embodiment. Referring to FIG. 6 to FIG. 13, the method of forming a semiconductor structure includes:

Referring to FIG. 7, a base 20, an initial gate dielectric layer 21b, and a first gate 22 are provided.

The base 20 includes a source region (not shown), a drain region (not shown), and an initial gate dielectric layer 21b. The initial gate dielectric layer 21b is located between the source region and the drain region, and defines an initial groove. The source region and the drain region are located on two opposite sides at the top of the initial groove. The initial groove has an extension direction parallel to a surface of the base 20.

The first gate 22 includes a first work function layer 221 and a first conductive layer 222. The first gate 22 is filled in the initial groove. The first work function layer 221 covers a bottom surface and partial sidewall of the initial groove. The first conductive layer 222 covers a surface of the first work function layer 221. A top surface of the first conductive layer 222 is flush with or lower than a top surface of the first work function layer 221. Generally, the first work function layer 221 is substantially a blocking layer, configured to block metal ions in the first conductive layer 222 from migrating to the initial gate dielectric layer 21b and the base 20. A material of the first work function layer 221 includes titanium nitride, and a material of the first conductive layer 222 includes tungsten.

Since the second gate further needs to be placed on top of the first gate 22, a vertical distance between a top surface of the first gate 22 and a top surface of the base 20 in a direction perpendicular to the surface of the base 20 should be greater than a maximum doping depth of the source region and the drain region to ensure that a position relationship between the subsequently formed second gate and the source region as well as the drain region meets the performance requirements of the buried word line.

Figure 8:
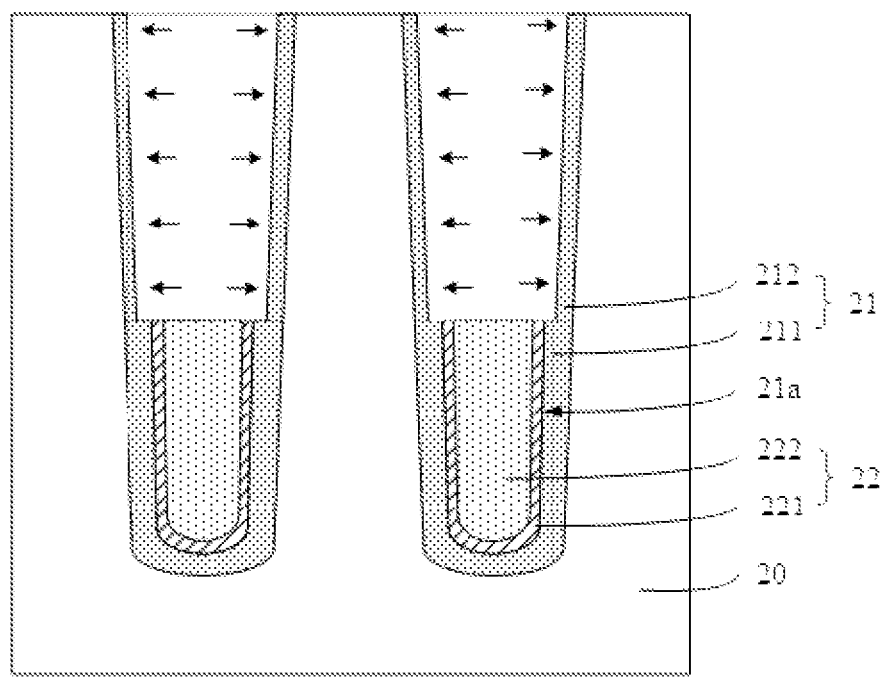

Referring to FIG. 7 and FIG. 8, an exposed part of the initial gate dielectric layer 21b is etched to form a gate dielectric layer 21.

By etching the uncovered part of the initial gate dielectric layer 21b with the first gate 22 as a mask, the width of the initial gate dielectric layer 21b can be partially reduced, leaving more space for the second gate subsequently formed on top of the first gate 22. The above "width" refers to a width in a direction parallel to the surface of the base 20 in the cross section perpendicular to the extension direction of the initial groove. Unless otherwise specified, the "width" mentioned hereinafter is the width in this direction, and details are not described herein again.

After the etching process, the remaining part of the initial gate dielectric layer 21b is used as the gate dielectric layer 21. The gate dielectric layer 21 can be divided into a first part 211 covered by the first gate 22 and a second part 212 exposed by the first gate 22. The subsequently formed second gate covers partial surface of the second part 212. The gate dielectric layer 21 defines a groove 21a. Compared with the initial groove, the groove 21a has larger top space, which can accommodate a wider second gate. The extension direction of the groove 21a is the same as the extension direction of the initial groove.

In this embodiment, the etching process is a wet etching process, which facilitates the uniform etching of the exposed part of the initial gate dielectric layer 21b, so that the widths at different positions of parts of the second part 212 are equal or tend to be equal in the direction perpendicular to the surface of the base 20, ensuring that the second part 212 of the gate dielectric layer 21 has a stable performance and a better isolation effect. This helps to avoid ion bombardment damage on the top surface of the first gate 22, and ensures that the first gate 22 has a small contact resistance with the subsequently formed second gate.

Figure 9:
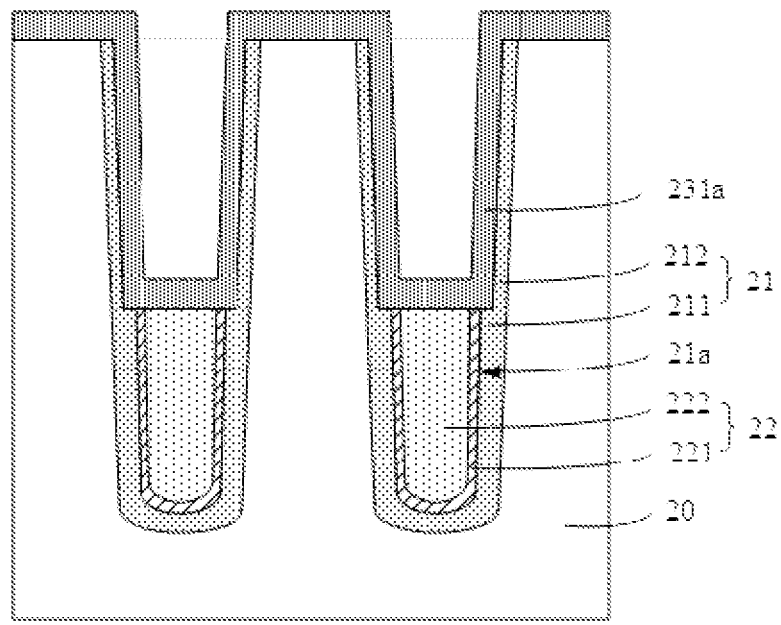

Referring to FIG. 9, a second work function film 231a is formed.

After the gate dielectric layer 21 is formed, the second work function film 231a covering the surface of the base 20, the surface of the second part 212, the top surface of the first part 211, and the top surface of the first gate 22 is deposited. In a horizontal direction perpendicular to the extension direction and parallel to the surface of the base 20 (referred to as "horizontal direction" for short hereinafter), a width of the second work function film 231a is greater than a width of the first work function layer 221; a sum of the width of the second work function film 231a and the width of the second part 212 is less than or equal to a sum of the width of the first work function layer 221 and the width of the first part 211.

In this embodiment, a work function of a material of the second work function film 231a is less than a work function of a material of the first work function layer 221, and the material of the second work function film 231a includes lanthanum.

Figure 10:
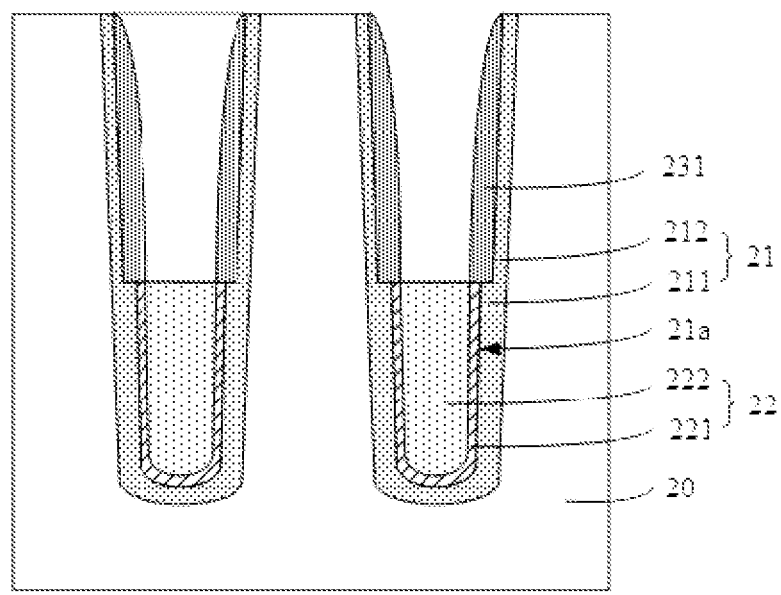

Referring to FIG. 9 and FIG. 10, the second work function film 231a is etched back.

The second work function film 231a is etched back, to expose the first conductive layer 222, ensuring an effective contact between the subsequently formed second conductive layer and the first conductive layer.

In this embodiment, the second work function film 231a covering the surface of the base 20 and covering the surface of the first conductive layer 222 by using the back etching process. The second work function film 231a covering the surface of the second part 212, the top surface of the first part 211 and the top surface of the first work function layer 221 is retained. In the cross section perpendicular to the extension direction, an interface of a region enclosed by the remaining part of the second work function film 231a is an inverted trapezoid. In the horizontal direction, a minimum width of the inverted trapezoid is greater than or equal to a maximum width of the first conductive layer 222.

In this embodiment, the back etching process is a wet etching process, which helps to avoid ion bombardment damage to the surface of the first conductive layer 222, and ensures that the first conductive layer 222 has a low contact resistance with the second conductive layer formed subsequently.

Since the etching molecules always tend to converge to the middle in the wet etching process, the remaining part of the second work function film 231a has decreasing widths at different positions in the direction extending from the first part 211 towards the second part 212.

Figure 11:
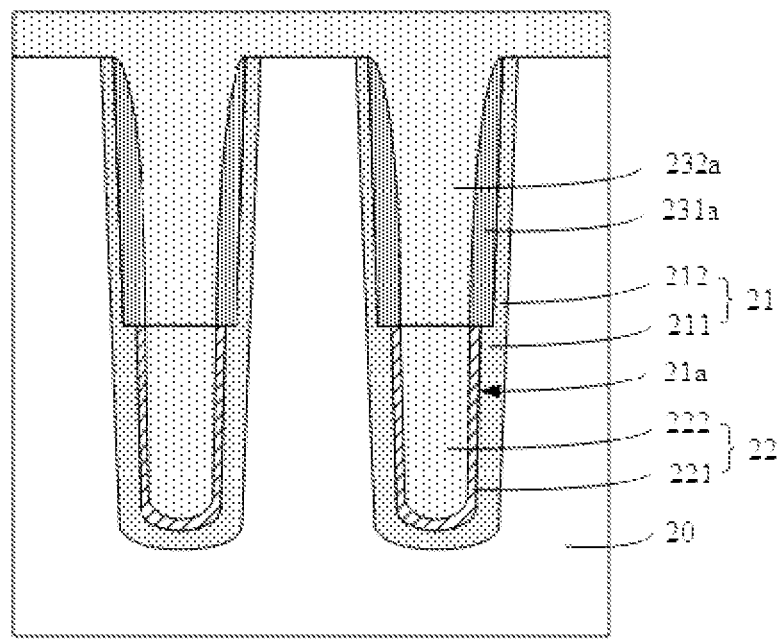
Figure 12:
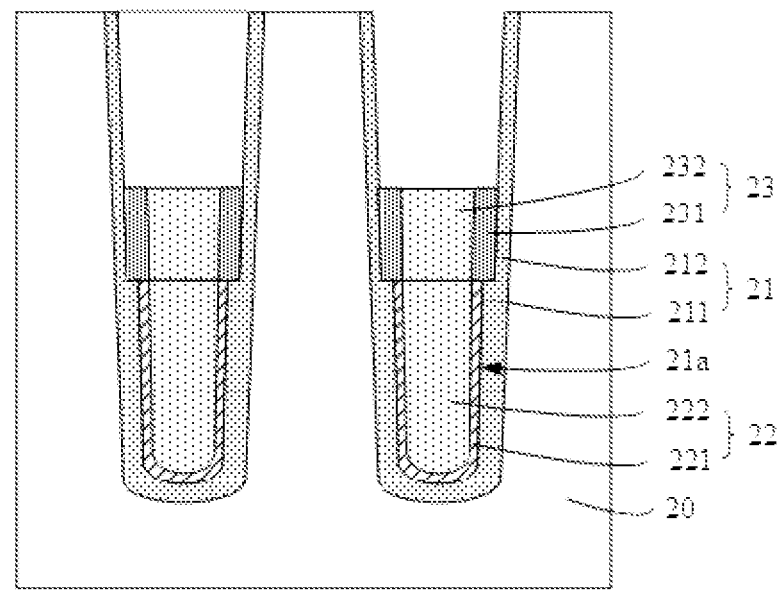

Referring to FIG. 11 and FIG. 12, a second conductive layer 232 and a second gate 23 are formed.

After the second work function film 231a is etched back, the second conductive film 232a that fully fills the groove 21a is formed; the second conductive film 232a and the second work function film 231a are etched back, to form a second work function layer 231 and a second conductive layer 232.

The second work function layer 231 and the second conductive layer 232 form the second gate 23.

In this embodiment, a material of the second conductive layer 232 is the same as a material of the first conductive layer 222. The material of the first conductive layer 222 includes tungsten. In other embodiments, the material of the second conductive layer 232 may be different from the material of the first conductive layer 222, and resistivity of the material of the second conductive layer is less than that of the material of the first conductive layer.

Figure 13:
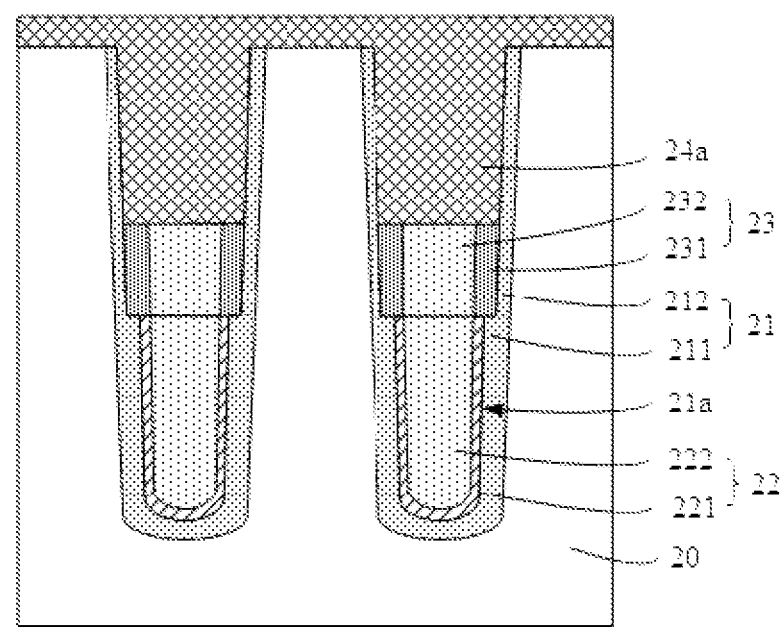

Referring to FIG. 13 and FIG. 1, an isolation layer 24 is formed.

After the second gate 23 is formed, an isolation film 24a that fully fills the groove 21a and covers the surface of the base 20 is formed; a planarization process is formed on the isolation film 24a, and a part of the isolation film 24a filled in the groove 21a is retained as the isolation layer 24.

In this embodiment, the resistance of per unit thickness of the second conductive layer 232 is set to be small, so that the partial voltage of the second conductive layer 232 can be reduced without changing the thickness of the first conductive layer 222 and the second conductive layer 232 and without reducing the driving voltage of the semiconductor structure, thus weakening the electric field between the second gate 23 and the drain, so as to reduce the GIDL current caused by the strong electric field and improve the refresh performance of the semiconductor structure.

Each embodiment or implementation in the specification of the present disclosure is described in a progressive manner. Each embodiment focuses on the difference from other embodiments, and the same and similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

Embodiments of the present disclosure provide a semiconductor structure and a forming method thereof, which help to reduce the drain leakage of the semiconductor structure and improve the refresh performance of the semiconductor structure.

The invention claimed is:

1. A semiconductor structure, comprising:
  a base, comprising a source region, a drain region, and a gate dielectric layer, wherein the gate dielectric layer is located between the source region and the drain region, the gate dielectric layer defines a groove, the source region and the drain region are located on two opposite sides at a top of the groove, and the groove has an extension direction parallel to a surface of the base;
  a first gate, comprising a first work function layer and a first conductive layer, wherein the first gate is filled in the groove, the first work function layer covers a bottom surface and partial sidewall of the groove, the first conductive layer covers a surface of the first work function layer, and a top surface of the first conductive layer is flush with or lower than a top surface of the first work function layer;
  a second gate, comprising a second work function layer and a second conductive layer, wherein the second gate is laminated on the first gate and has a top surface lower than the surface of the base, the second work function layer covers partial sidewall of the groove, the second conductive layer covers a surface of the second work function layer, a top surface of the second conductive layer is flush with or lower than a top surface of the second work function layer, and in a direction perpendicular to the surface of the base, resistance of per unit thickness of the second conductive layer is less than resistance of per unit thickness of the first conductive layer; and
  an isolation layer, laminated on the second gate and fully filling the groove; and,
  wherein in a cross section perpendicular to the extension direction, a horizontal width of the second work function layer is greater than a horizontal width of the first work function layer.

2. The semiconductor structure according to claim 1, wherein
  in a cross section perpendicular to the extension direction, a cross section of the second conductive layer is an inverted trapezoid, and in a horizontal direction parallel to a bottom base of the inverted trapezoid, a minimum width of the second conductive layer is greater than or equal to a maximum width of the first conductive layer.

3. The semiconductor structure according to claim 2, wherein
  a material of the second conductive layer is the same as a material of the first conductive layer.

4. The semiconductor structure according to claim 1, wherein resistivity of a material of the second conductive layer is less than resistivity of a material of the first conductive layer.

5. The semiconductor structure according to claim 1, wherein
a work function of a material of the first work function layer is greater than a work function of a material of the second work function layer.

6. The semiconductor structure according to claim 5, wherein
the first work function layer is made of one material, and the second work function layer is made of another material.

7. The semiconductor structure according to claim 1, wherein
the gate dielectric layer comprises a first part covered by the first gate and a second part covered by the second gate, and in a horizontal direction perpendicular to the extension direction and parallel to the surface of the base, a width of the second part is less than a width of the first part.

8. The semiconductor structure according to claim 7, wherein
in the horizontal direction, a sum of a width of the first work function layer and the width of the first part is denoted as a first width, a sum of a width of the second work function layer and the width of the second part is denoted as a second width, and the second width is less than or equal to the first width.

9. The semiconductor structure according to claim 1, wherein
the first work function layer is made of one material, and the second work function layer is made of another material.

10. The semiconductor structure according to claim 1, wherein
the gate dielectric layer comprises a first part covered by the first gate and a second part covered by the second gate, and in a horizontal direction perpendicular to the extension direction and parallel to the surface of the base, a width of the second part is less than a width of the first part.

11. A method of forming a semiconductor structure, comprising:
providing a base, the base comprises a source region, a drain region, and a gate dielectric layer, wherein the gate dielectric layer is located between the source region and the drain region, the gate dielectric layer defines a groove, the source region and the drain region are located on two opposite sides at a top of the groove, and the groove has an extension direction parallel to a surface of the base;
forming a first gate, the first gate comprises a first work function layer and a first conductive layer, wherein the first gate is filled in the groove, the first work function layer covers a bottom surface and partial sidewall of the groove, the first conductive layer covers a surface of the first work function layer, and a top surface of the first conductive layer is flush with or lower than a top surface of the first work function layer;
forming a second gate, the second gate comprises a second work function layer and a second conductive layer, wherein the second gate is laminated on the first gate and has a top surface lower than the surface of the base, the second work function layer covers partial sidewall of the groove, the second conductive layer covers a surface of the second work function layer, a top surface of the second conductive layer is flush with or lower than a top surface of the second work function layer, and in a direction perpendicular to the surface of the base, resistance of per unit thickness of the second conductive layer is less than resistance of per unit thickness of the first conductive layer; and forming an isolation layer, the isolation layer is laminated on the second gate and fills the groove; and, wherein in a cross section perpendicular to the extension direction, a horizontal width of the second work function layer is greater than a horizontal width of the first work function layer.

12. The method of forming a semiconductor structure according to claim 11, wherein
providing the gate dielectric layer and the forming a first gate comprise:
providing an initial gate dielectric layer, the initial gate dielectric layer defining an initial groove;
forming the first gate, the first gate covering a bottom surface and partial sidewall of the initial groove; and
etching an uncovered part of the initial gate dielectric layer by using the first gate as a mask, to reduce a thickness of the uncovered part of the initial gate dielectric layer along a horizontal direction perpendicular to the extension direction and parallel to the surface of the base, and using a remaining part of the initial gate dielectric layer as the gate dielectric layer.

13. The method of forming a semiconductor structure according to claim 12, wherein
forming the second work function layer comprises:
after forming the first gate, forming a second work function film covering a sidewall of the groove and a top surface of the first gate; and
etching back the second work function film, to expose the first conductive layer; wherein in a cross section perpendicular to the extension direction, a cross section of a region enclosed by a remaining part of the second work function film is an inverted trapezoid, and in the horizontal direction, a minimum width of the inverted trapezoid is greater than or equal to a maximum width of the first conductive layer.

14. The method of forming a semiconductor structure according to claim 13, wherein
the second work function film is etched back by using a wet etching process.

15. The method of forming a semiconductor structure according to claim 13, wherein
the forming a second gate comprises:
after the etching back the second work function film, forming a second conductive film filling the groove; and
etching back the second work function film and the second conductive film, and forming the second gate, wherein the top surface of the second gate is lower than the surface of the base.

16. The method of forming a semiconductor structure according to claim 15, wherein
a material of the second conductive film is the same as a material of the first conductive layer.

* * * * *